US010564672B1

(12) United States Patent
Chen et al.

(10) Patent No.: US 10,564,672 B1
(45) Date of Patent: Feb. 18, 2020

(54) ELECTRONIC SUBASSEMBLY AND MANUFACTURING METHOD THEREOF

(71) Applicant: Google LLC, Mountain View, CA (US)

(72) Inventors: Liwen Chen, Mountain View, CA (US); Valentin de la Fuente, San Jose, CA (US); Vivek Saini, Sunnyvale, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 16/100,792

(22) Filed: Aug. 10, 2018

(51) Int. Cl.
*G06F 1/16* (2006.01)
*H05K 13/04* (2006.01)
*H05K 7/02* (2006.01)
*H01H 13/705* (2006.01)

(52) U.S. Cl.
CPC ......... *G06F 1/1633* (2013.01); *H01H 13/705* (2013.01); *H05K 7/026* (2013.01); *H05K 13/0452* (2013.01)

(58) Field of Classification Search
CPC .......................... H01H 13/705; G06F 1/1626
USPC .......................... 200/520; 29/592, 592.1, 622
See application file for complete search history.

(56) References Cited

U.S. PATENT DOCUMENTS

| 5,541,809 | A | 7/1996 | Kakizaki et al. | |
|---|---|---|---|---|
| 5,617,301 | A * | 4/1997 | Sato | G06F 1/1616 312/223.2 |
| 9,105,899 | B2 | 8/2015 | Pakula et al. | |
| 10,348,354 | B1 * | 7/2019 | Balourdet | H04B 1/3888 |
| 2006/0205271 | A1 * | 9/2006 | Hsu | H01R 13/73 439/573 |
| 2009/0257207 | A1 * | 10/2009 | Wang | G06F 1/1626 361/752 |
| 2011/0166690 | A1 * | 7/2011 | Ternus | G06F 1/1613 700/117 |
| 2011/0228494 | A1 * | 9/2011 | Xiao | H01H 13/705 361/752 |
| 2011/0255218 | A1 * | 10/2011 | Pakula | G06F 1/1626 361/679.01 |
| 2011/0255259 | A1 | 10/2011 | Weber et al. | |

(Continued)

FOREIGN PATENT DOCUMENTS

| CN | 105225871 A | 1/2016 |
|---|---|---|
| WO | 2016165300 A1 | 10/2016 |
| WO | 2017105075 A1 | 6/2017 |

OTHER PUBLICATIONS

International Search Report and Written Opinion for Application No. PCT/US2019/045117, dated Nov. 19, 2019, 14 pages.

*Primary Examiner* — Anthony Q Edwards
(74) *Attorney, Agent, or Firm* — Brake Hughes Bellermann LLP (57) ABSTRACT

An electronics subassembly for a computing device that receives a pressing force from a user is disclosed. The electronics subassembly is mounted in the computing device using fasteners that are aligned parallel to the pressing force to prevent unwanted flexure of the electronics subassembly. The orientation of the fasteners requires holes to be form in a direction that is not suited for a standard tool. As a result, the manufacturing method includes forming the holes through an aperture in a sidewall of the housing of the computing device so that the bulk of the tool used for drilling is not constrained by the interior dimensions of the housing.

19 Claims, 7 Drawing Sheets

(56) References Cited

U.S. PATENT DOCUMENTS

| | | | |
|---|---|---|---|
| 2012/0000760 A1* | 1/2012 | Lutgring | H01H 9/22 200/520 |
| 2012/0044660 A1 | 2/2012 | Rappoport et al. | |
| 2012/0048706 A1* | 3/2012 | Jung | H01H 13/85 200/512 |
| 2014/0069794 A1* | 3/2014 | Lin | H01H 13/705 200/529 |
| 2014/0075743 A1* | 3/2014 | McClure | G06F 1/1626 29/592.1 |
| 2014/0347000 A1* | 11/2014 | Hamann | G06F 1/189 320/103 |
| 2015/0125227 A1 | 5/2015 | Muller et al. | |
| 2015/0294808 A1* | 10/2015 | Liu | H01H 3/12 200/344 |
| 2016/0233037 A1* | 8/2016 | Lee | H01H 13/705 |
| 2017/0070254 A1* | 3/2017 | Lee | G06F 1/1626 |
| 2017/0118319 A1 | 4/2017 | Jun et al. | |
| 2017/0238431 A1 | 8/2017 | Lee et al. | |
| 2018/0183912 A1* | 6/2018 | Lim | G06F 1/1652 |
| 2019/0096610 A1* | 3/2019 | Kanemaki | G06F 1/16 |

* cited by examiner

ELECTRONIC SUBASSEMBLY AND MANUFACTURING METHOD THEREOF

FIELD OF THE DISCLOSURE

The present disclosure relates generally to a computing device and more specifically to an electronics subassembly and manufacturing method thereof.

BACKGROUND

A computing device may have a size and a shape that balances the demands of portability and usability. The computing device may have relatively large height and width dimensions to ease display viewing, while also having a relatively small depth defined by sidewalls to ease holding and carrying. One or more electronic subassemblies for control (e.g., one or more buttons or switches) can be located in the sidewalls of the computing device so that a user holding the device can interact with the controls by applying a pressing force without significantly altering the user's hold of the device. Manufacture of the computing device requires attaching the electronic subassemblies to a housing so that they the can sustain the applied pressing force. The size and shape of the computing device, however, may place constraints on how this attachment may be achieved. Thus, a need exists for a new electronic subassemblies and manufacturing methods thereof.

SUMMARY

In one general aspect, the present disclosure describes a computing device that includes a housing. The housing defines an interior and an aperture in a sidewall. Additionally, a first boss and a second boss are defined within a bottom interior surface of the housing and located behind the aperture. The first boss has a first surface that faces the aperture and the second boss has a second surface that faces the aperture. The computing device further includes a button having a top portion that protrudes through the aperture a bottom portion that is attached to the first boss using a first fastener through a first hole in the first boss and attached to the second boss using a second fastener through a second hole in the second boss. The first hole through the first boss is formed at the first surface using a tool through the aperture in the sidewall, and the second hole through the second boss is formed at the second surface using the tool through the aperture in the sidewall.

In another general aspect, the present disclosure describes a method. The method includes inserting a tool through an aperture in a sidewall of a housing for a computing device and into contract with a first boss defined within a bottom interior surface of the housing. A first hole is then formed through the first boss in a direction normal to the aperture using the inserted tool. Likewise the method includes inserting the tool through the aperture in the sidewall and into contract with a second boss defined within a bottom interior surface of the housing adjacent to the first boss. A second hole is then formed through the second boss in a direction normal to the aperture using the inserted tool. Finally an electronics subassembly is mounted to the first boss using a first fastener through the first hole and to the second boss using a second fastener through the second hole. When mounted, the electronics subassembly has a top portion that protrudes through the aperture.

In another general aspect, the present disclosure describes a method that includes inserting a tool through a slot in a sidewall of a housing so that the distal end of the tool is within an interior defined by the housing. Then, a hole is formed through a boss that is integral with a bottom interior surface of the housing. The hole is formed with the tool inserted through the slot and the tool makes no contact with the edges of the aperture during the formation of the hole. Next, a button is positioned so that a top portion of the button protrudes through the slot and so that a threaded hole in a bottom portion of the button is aligned with the hole in the boss. Finally, the button is mounted to the boss using a fastener through the hole in the boss.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

Like reference symbols in the various drawings indicate like elements.

DETAILED DESCRIPTION

The present disclosure describes a computing device with an electronic subassembly mounted in a way that accommodates a limited space and that provides a solid feel when pressed. The manufacture of the computing device utilizes an aperture in a sidewall of a housing to provide clearance for a tool that is used to form one or more holes for mounting the electronics subassembly. The size, shape, and arrangement of the disclosed structure ease manufacturing requirements (e.g., tooling, parts, and operations), while providing an improved mounting connection that is more resistant to a pressing force applied on the electronic subassembly.

Figure 1:
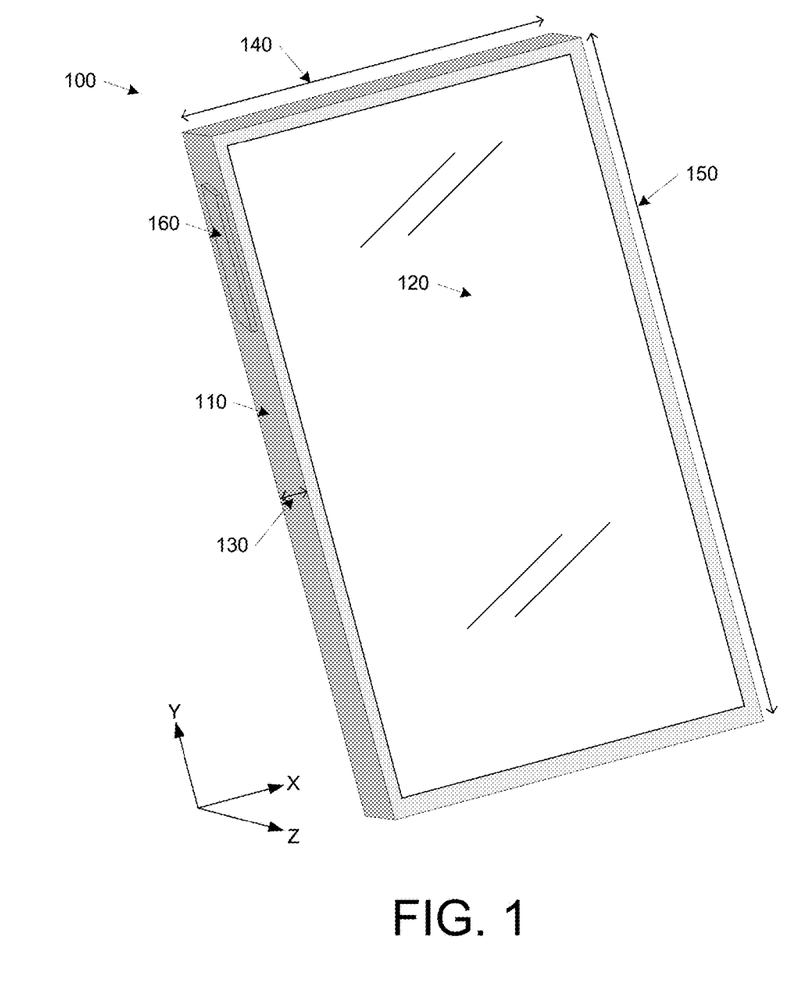
FIG. 1 is a perspective view of a computing device according to an embodiment of the present disclosure.

An example of a computing device 100 is shown in FIG. 1. The computing device 100 (e.g., a tablet computer or a smart phone) has a housing 110 that contains and supports electronics within an interior defined by the housing. The housing also supports display 120 and at least one button 160 for human interaction. The housing 110 may be constructed from various materials, including metal or plastic. A metal material may be desirable due to its thermal properties, rigidity, and durability. The housing 110 may be unitary or may be constructed from multiple pieces that are mechanically coupled to form the housing. The housing is generally rectangular and may include rounded edges or sidewalls to ease handling and/or to be aesthetically pleasing. The display 120 typically occupies all or a portion of one side of the rectangular shape defined by housing. Additionally, the housing 110 may have one or more apertures formed in one or more side walls to provide clearance for one or more electronic subassemblies (i.e., controls, buttons, switches, etc.). For example, the housing may have an aperture (e.g., slot) to accommodate a button 160. The button may be shaped according to the aperture so that a top portion of the button 160 protrudes through the aperture when mounted at mounting points defined within the interior of the housing. The housing defines an x-dimension 140 (i.e., width), a y-dimension 150 (i.e., height), and a z-dimension (i.e., depth) 130. In operation, a user may interact with the button 160 by applying a pressing force to the button 160 in a direction that is substantially parallel to the x-dimension 140 direction (i.e., towards the aperture). An aspect of the present disclosure includes a mounting configuration for the button that counteracts the pressing force applied to the button without any perceived flexure other than from the button mechanism. In other words, the mounting configuration provides a user with a perception of solid construction (i.e., provides a good "click-feel"). Accordingly, the disclosed mounting configuration advantageously does flex or bend as the volume button is pressed.

To provide the advantage described, the disclosed mounting configuration supports the button at a bottom surface, which is opposite to a top surface to which a pressing force is applied. In other words, an aspect of the disclosed mounting configuration is that it does not rely on any cantilever type connection in which the mounting point acts as fulcrum and the body of the button acts a lever.

Figure 2:
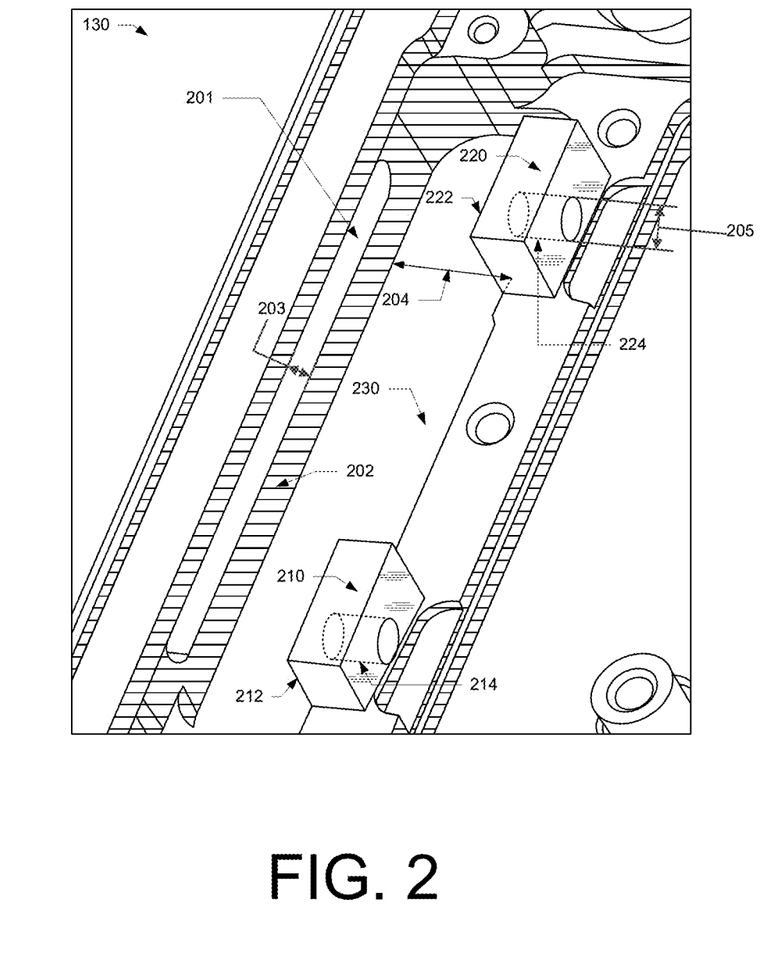
FIG. 2 is a perspective cutaway interior view of a housing for a computing device according to a possible embodiment of the present disclosure.

A perspective cutaway interior view of a housing 130 is shown in FIG. 2. The housing 130 for a computing device 100 shown in the figure includes a first boss 210 and a second boss 220 that are integral with a bottom interior surface 230 of the housing 130. The mounting configuration shown in FIG. 2 is an example embodiment. In general, the configuration may utilize any number of bosses (e.g., one, two, three, etc.). The bosses may be formed (i.e., machined) as part of the bottom interior surface 230 or may be affixed to the bottom interior surface 230. The first boss 210 has a first surface 212 (e.g., flat surface) that faces an aperture 201 in a sidewall 202 of the housing (i.e., the first boss is located behind the aperture). The second boss 220 is adjacent to the first boss 210 and has a second surface 222 that also faces the aperture 201 (i.e., the second boss is located behind the aperture). The first and second surfaces are typically the located at the same distance behind the aperture, which is large enough to accommodate the electronic subassembly (i.e., button). For example, a distance 204 between the sidewall 202 of the housing (i.e., at the aperture 201) and each of the first boss and the second boss is less than 9 millimeters (e.g., 8.8 mm).

To serve as a mounting point, the first boss 210 has a first hole 214 formed through the boss 210 in a direction substantially normal to the first surface 212 and the second boss has a second hole 224 formed through the boss 220 in a direction that is substantially normal to the second surface 222. The holes typically have the same diameter but in a possible embodiment may be sized differently. For example, the diameter of the first hole and the second hole may be less than 1.5 millimeters (e.g., 1.45 mm). The first hole and the second hole may each be sized to provide clearance for a first fastener (e.g., a first screw) and a second fastener (e.g., a second screw). The height of the first hole 214 and the second hole 224 above the bottom interior surface 230 of the housing corresponds to the height/dimensions of the aperture 201 in the sidewall 202 of the housing and is typically less than 3 millimeters (e.g., 2.9 mm).

The manufacture of the mounting configuration requires the formation of the first hole 214 and the second hole 224. The first and second hole may be formed by drilling; however, the dimensions of the mounting configuration are not compatible with convention tools and techniques for drilling. In particular, the height of holes above the bottom interior surface is too small to provide adequate clearance for a conventional drill mechanism (e.g., a collet, a chuck, etc.). For example, the most advanced machine tooling (e.g., computer numerical control, CNC, tooling) that is conventionally available requires a clearance of at least 20 millimeters. Additionally, a drill bit used to form the holes is constrained in length. In particular, obtaining a hole having a diameter within a small tolerance is difficult using a drill bit with a small ratio of diameter to length (D/L). In other words, because the drill bit used to form the hole is typically around 1.5 millimeters in diameter (D) the length (L) of the drill bit cannot be much greater than 10 millimeters to form holes that are precise enough to provide secure mounting points for the button.

Holes with tight tolerances help provide the good "click-feel" described previously. Additionally, using convention tooling reduces the cost and increases the efficiency of the manufacturing process. Accordingly, an aspect of the present disclosure is the use of a conventional tool to form holes in the bosses despite the mounting configuration having dimensions that are smaller than the required clearances for the conventional tool. To achieve this aspect, the holes through each boss are formed using the tool through the aperture in the side wall. In some cases, the bottom interior surface of the housing and the height of the holes prevent forming the holes other than by the tool through the aperture in the sidewall.

The tool used for forming the holes is typically a drill (i.e., drill bit) but the principle of forming the holes through the aperture can be applied to other tools as well (e.g., milling bit, laser cutters, water jet, electrical discharge machining, etc.), and these various tools are within the scope of the present disclosure.

Figure 3:
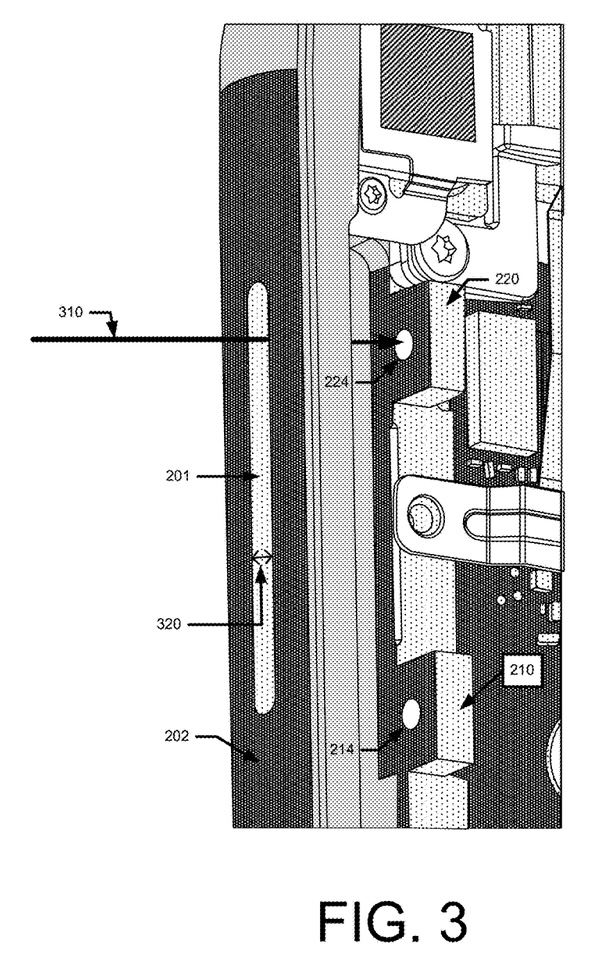
FIG. 3 is a perspective cutaway exterior view of a computing device according to a possible embodiment of the present disclosure.

A perspective cutaway exterior view of a computing device is shown in FIG. 3. To form the first hole 214 through the first boss 210 (and a second hole 224 through the second boss 224) in a direction normal to the aperture 201 the tool is inserted (or directed) through the aperture 201 in the sidewall 202 as shown by the arrow 310 in FIG. 3. Because the tool operates through the aperture 201, the tool is not hindered by the clearance problems created by the small height (e.g., 2.9 mm) of the holes above the bottom interior surface of the housing. Additionally, because the distance 204 between the sidewall 202 of the housing and each boss is less than 9 millimeters (e.g., 8.8 mm) and because the diameters of the holes are each less than 1.5 millimeters (e.g., 1.45 mm), the D/L ratio of a drill bit used for drilling the holes is sufficiently high to insure that the drilled diameters of the holes conform to a tight tolerance.

To drill the hole in the first boss, a drill bit is inserted through the sidewall of the housing so that the distal end of the drill bit contacts the first surface 212 of the first boss 210. This process is repeated to drill the hole in the second boss. In other words, an aspect of the present disclosure is to form a hole though a boss located within an interior of a housing through an aperture in a sidewall of the housing so that bulky parts of the tool may remain exterior to the housing.

The aperture 201 in the sidewall 202 of the housing 130 is shaped to accommodate a top portion of a button. The shape of the aperture may be (but is not limited to) a rectangular slot with rounded ends, as shown in FIG. 3. The slot is long enough to accommodate drilling each of the adjacent holes and has a narrow dimension 320 (i.e., slot width) that is less than 2 millimeters (e.g., 1.7 mm). The slot width is large enough to allow a drill bit for drilling a 1.45 millimeter hole through each boss without contact between the drill bit and the edges of the slot. An aspect of the present disclosure is that during the formation of the holes, a tool makes no contact with the edges of the slot. Because the edges of the slot may be visible to a user, damage to the edges of the slot is not generally acceptable.

The arrangement of the aperture (e.g., slot) and the bosses can aid in the formation of the hole. For example, one or more features (e.g., an edge) of the aperture may be used to position the tool prior to forming the hole.

Figure 4:
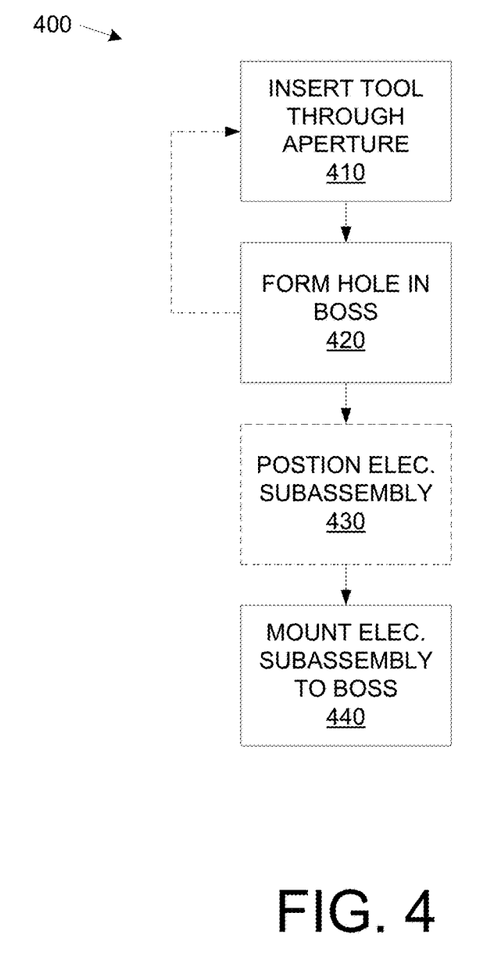
FIG. 4 is a flowchart of a method for a manufacturing method according to a possible embodiment of the present disclosure.

A method 400 for manufacturing the electronic subassembly of the computing device is shown in FIG. 4. As discussed, the tool is inserted 410 through the aperture to form 420 a first hole through the first boss. This process may be repeated for additional contact points. For example, the tool may be reinserted through the aperture (or repositioned within the aperture) to form 420 a second hole through the second boss. The direction of each hole is typically normal to the aperture (i.e., the axis of each hole is normal to a plane defined by aperture), as shown in the embodiment of FIG. 3. The disclosure, however, is not limited to this direction because holes having various angles may be formed using the tool through the aperture.

After the holes are formed, an electronic subassembly may be positioned 430 for mounting. The electronics subassembly may have a top portion that is shaped according to the aperture and a bottom portion that has one or more attachment points (e.g., threaded holes) for attachment to the bosses via the holes. Accordingly, the positioning 430 may include inserting the top portion through the aperture and aligning the attachment points of the bottom portion with the holes of the bosses. After the electronic subassembly is positioned, it is mounted 440 (i.e., attached, affixed, etc.) to the boss.

Figure 5:
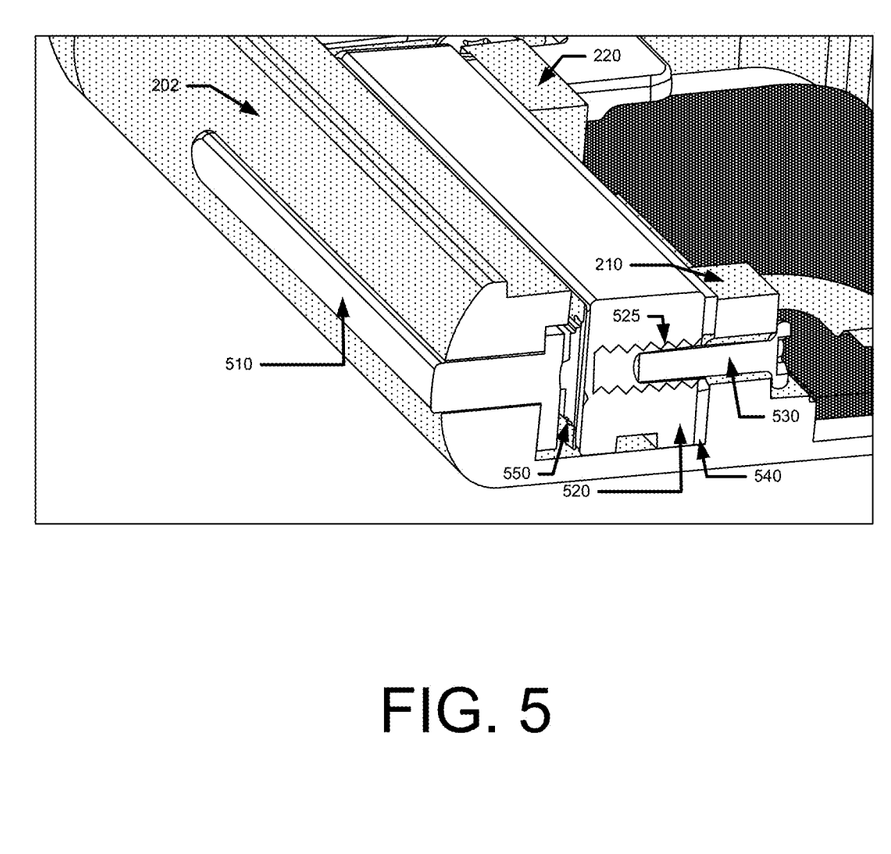
FIG. 5 is a first perspective cutaway interior view of an electronic subassembly mounted in a computing device according to a possible embodiment of the present disclosure.

FIG. 5 is a cut-away perspective view of the volume button mounted in the computing device. As shown, the volume button includes a top portion 510 that protrudes through the aperture in the sidewall 202 when mounted to the first boss 210 and the second boss 220. The top portion is typically shaped to closely fit the aperture. The volume button also includes a bottom portion 520 that has a first threaded hole 525 and a second threaded hole (not shown) for receiving a first fastener 530 and a second fastener (not shown). The fasteners may be screws of various sizes (e.g., M1 screw) and lengths to accommodate the particular embodiment. The first boss has a first surface that faces the aperture and the second boss has a second surface that faces the aperture. When tightened, the first fastener 530 holds the electronic subassembly firmly against the first surface and the second fastener hold the electronic subassembly firmly against the second surface. In some cases, the electronic subassembly further includes a shim 540 that is placed between the bottom portion of the volume button 520 and the first boss 210 and the second boss 220. The shim (or shims) insures a tight fit between the volume button and the bosses. By using a shim, the bottom portion of the volume button may be sized so that it can be easily positioned between the top portion and the bosses during assembly. Then, after it is positioned, the extra space between the bottom portion of the volume button 520 and the first and second surfaces of the first and second bosses 210, 220 respectively may be filled with the shim 540.

FIG. 5 further illustrates that the electronic subassembly may include a switch 550 (e.g., surface mount technology (SMT) switch) that may provide the electrical function of the volume button. For example, when a force applied to a top portion 510 of the volume button can compress and/or displace the material (e.g., elastomeric material) of the top portion 510 so that the switch makes or brakes electrical contact.

Figure 6:
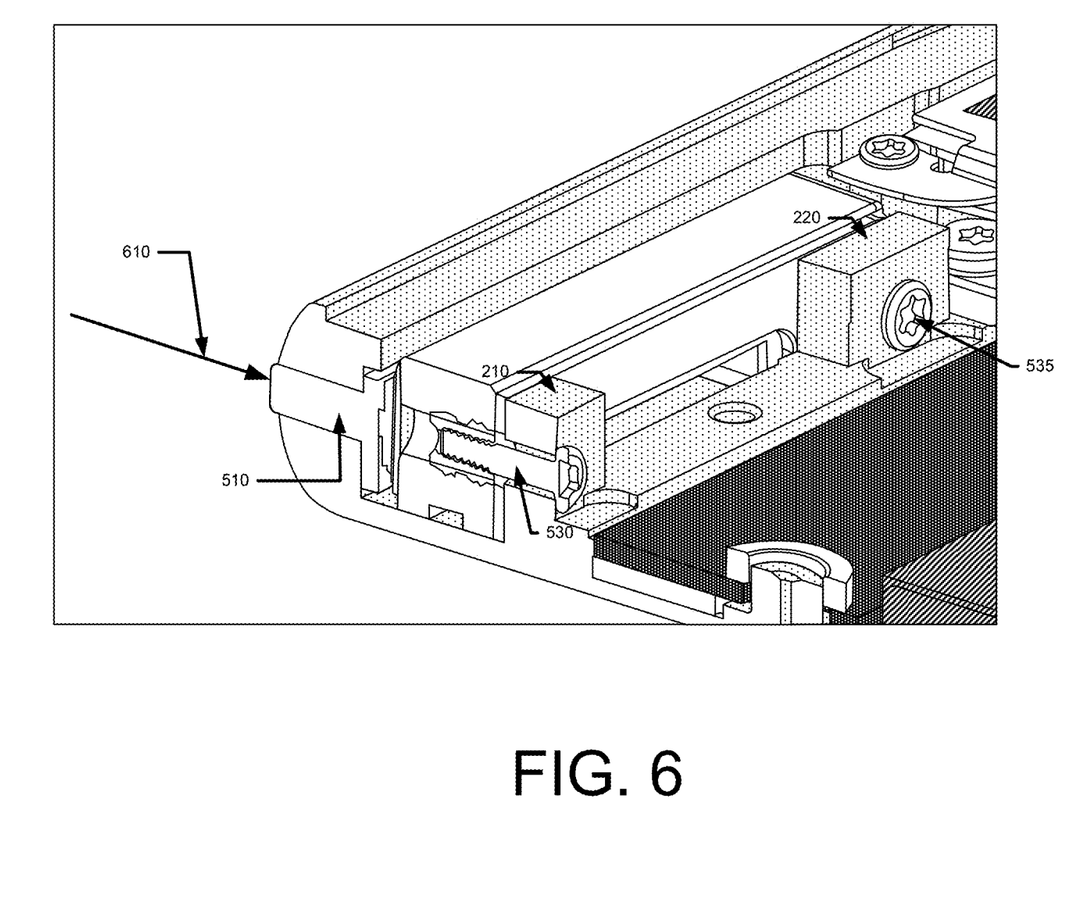
FIG. 6 is a second perspective cutaway exterior view of an electronic subassembly mounted in a computing device according to a possible embodiment of the present disclosure.

FIG. 6 is a cut-away perspective view of the volume button mounted in the computing device from a different perspective (i.e., than shown in FIG. 5). When a pressing force 610 is applied to the top portion of the button 510 in a direction towards the aperture, the first boss 210 and the second boss each provide a force that counteracts the pressing force 610. In this way, any additional flexure of the electronics assembly, other than from the compression of the top portion and the action of the switch is minimized or eliminated for the entire range of (expected) pressing forces.

As mentioned, a first screw 530 and a second screw 535 may hold the bottom portion of the volume bottom against the first boss 210 and the second boss 220. In some embodiments the top portion 510 of the volume button is not affixed to the bottom portion but rather is captured within the housing by the bottom portion due to its cross-sectional shape as shown in FIG. 6. Thus, during positioning the top portion may be inserted to protrude through the aperture. Next, the bottom portion may be placed directed behind the top portion. Then, a shim may be inserted between the bottom portion and the bosses. Finally the first screw 530 and the second screw 535 may be tightened into the threaded holes of the bottom portion to complete the assembly. The screws may be tightened by hand or by machine, and the head of the screw (e.g., Torx head) may be selected to insure ease of assembly. For example, enough clearance exists in the embodiment shown in FIG. 6 for the screw may be tightened by hand.

Figure 7:
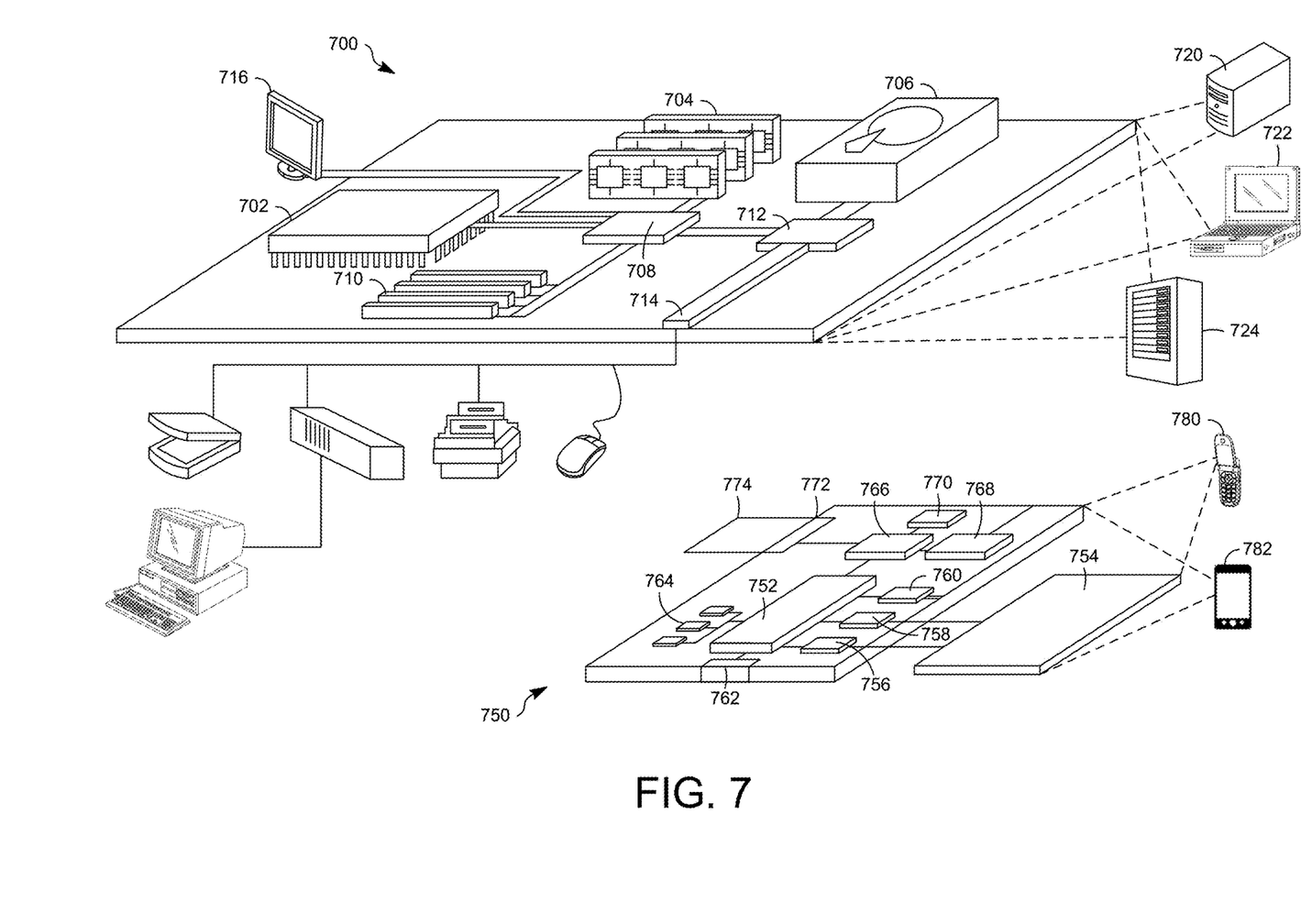
FIG. 7 shows an example of a computer device and a mobile computer device that can be used to implement the techniques described here.

FIG. 7 shows an example of a generic computer device 700 and a generic mobile computer device 750, which may be used with the techniques described here. Computing device 700 is intended to represent various forms of digital computers, such as laptops, desktops, tablets, workstations, personal digital assistants, televisions, servers, blade servers, mainframes, and other appropriate computing devices. Computing device 750 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. The processor 702 can be a semiconductor-based processor. The memory 704 can be a semiconductor-based memory. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 704, the storage device 706, or memory on processor 702.

The high speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provided in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provided as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, or memory on processor 752, that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, WiFi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 780. It may also be implemented as part of a smart phone 782, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

What is claimed is:

1. A computing device comprising:
a housing that defines an interior and an aperture in a sidewall of the housing;
a first boss defined within a bottom interior surface of the housing and located behind the aperture, the first boss having a first surface facing the aperture and a first hole formed through the first boss at the first surface using a conventional tool through the aperture in the sidewall, wherein the bottom interior surface of the housing and a height of the first hole prevent forming the first hole through the first boss other than by the conventional tool through the aperture in the sidewall;
a second boss defined within the bottom interior surface of the housing and located behind the aperture, the second boss having a second surface facing the aperture and a second hole formed through the second boss at the second surface using the conventional tool through the aperture in the sidewall, wherein the bottom interior surface of the housing and a height of the second hole prevent forming the second hole through the second boss other than by the conventional tool through the aperture in the sidewall; and
a button having a top portion protruding through the aperture and a bottom portion attached to the first boss using a first fastener through the first hole and to the second boss using a second fastener through the second hole.

2. The computing device according to claim 1, wherein the computing device is a tablet computer or a smart phone.

3. The computing device according to claim 1, wherein the first boss and the second boss each provide a force that counteracts a pressing force applied to the top portion of the button in a direction towards the aperture.

4. The computing device according to claim 1, wherein the first hole through the first boss and the second hole through the second boss each have a diameter of less than 1.5 millimeters.

5. The computing device according to claim 1, wherein the aperture is a slot having a narrow dimension that is less than 2 millimeters.

6. The computing device according to claim 1, wherein a distance between the sidewall of the housing at the aperture and each of the first boss and the second boss is less than 9 millimeters.

7. The computing device according to claim 1, wherein the first hole through the first boss and the second hole through the second boss are each at a height that is less than 3 millimeters above the bottom interior surface of the housing.

8. A method comprising:
inserting a conventional tool through an aperture in a sidewall of a housing for a computing device and into contact with a first boss defined within a bottom interior surface of the housing;
forming a first hole through the first boss in a direction normal to the aperture using the conventional tool inserted through the aperture, wherein the bottom interior surface of the housing and a height of the first hole prevent forming the first hole through the first boss other than by the conventional tool through the aperture in the sidewall;
inserting the conventional tool through the aperture in the sidewall of the housing for the computing device and into contact with a second boss defined within the bottom interior surface of the housing adjacent to the first boss;
forming a second hole through the second boss in the direction normal to the aperture using the conventional tool inserted through the aperture, wherein the bottom interior surface of the housing and a height of the second hole prevent forming the second hole through the second boss other than by the conventional tool through the aperture in the sidewall; and
mounting an electronic subassembly to the first boss using a first fastener through the first hole and to the second boss using a second fastener through the second hole, the electronic subassembly having a top portion protruding through the aperture when mounted.

9. The method according to claim 8, wherein computing device is a tablet computer or a smart phone.

10. The method according to claim 8, wherein the aperture is a slot and the electronic subassembly is a volume button having a top portion shaped according to the slot.

11. The method according to claim 10, wherein the volume button has a bottom portion that includes a first threaded hole and a second threaded hole for mounting.

12. The method according to claim 11, wherein the mounting an electronic subassembly to the first boss using a first fastener through the first hole and to the second boss using a second fastener through the second hole, comprises:
attaching the volume button to the first boss by passing a first screw through the first hole in the first boss and tightening the first screw in the first threaded hole of the bottom portion of the volume button; and
attaching the volume button to the second boss by passing a second screw through the second hole in the second boss and tightening the second screw into the second threaded hole of the bottom portion of the volume button.

13. The method according to claim 8, wherein the electronic subassembly is a switch that is activated by a pressing force applied to the top portion in a direction towards the aperture and the first boss and the second boss each provide a force that counteracts the pressing force when the switch is mounted.

14. The method according to claim 8, wherein the first hole through the first boss and the second hole through the second boss are each at a height that is less than 3 millimeters above the bottom interior surface of the housing.

15. The method according to claim 8, wherein the first hole through the first boss and the second hole through the second boss each have a diameter of less than 1.5 millimeters.

16. The method according to claim 8, wherein the aperture is a slot having a narrow dimension that is less than 2 millimeters.

17. The method according to claim 8, wherein a distance between the sidewall of the housing at the aperture and each of the first boss and the second boss is less than 9 millimeters.

18. A method comprising:
inserting a conventional tool through a slot in a sidewall of a housing so that thea distal end of the conventional tool is within an interior defined by the housing;
forming, using the conventional tool, a hole through a boss that is integral with a bottom interior surface of the housing, wherein the conventional tool makes no contact with edges of the slot during the forming, wherein the bottom interior surface of the housing and a height of the hole prevent forming the hole through the boss other than by the conventional tool through the slot in the sidewall;
positioning a button so that a top portion of the button protrudes through the slot and so that a threaded hole in a bottom portion of the button is aligned with the hole in the boss; and
mounting the button to the boss using a fastener through the hole in the boss.

19. The method according to claim 18 wherein:
the hole in the boss is at a height that is less than 3 millimeters above the bottom interior surface of the housing and the boss is at a distance of less than 9 millimeters from the slot.

\* \* \* \* \*

UNITED STATES PATENT AND TRADEMARK OFFICE
CERTIFICATE OF CORRECTION

PATENT NO. : 10,564,672 B1
APPLICATION NO. : 16/100792
DATED : February 18, 2020
INVENTOR(S) : Chen et al.

Page 1 of 1

It is certified that error appears in the above-identified patent and that said Letters Patent is hereby corrected as shown below:

In the Claims

In Column 12, Claim 18, Line 34, delete "thea" and insert -- a --, therefor.

Signed and Sealed this
Eighteenth Day of August, 2020

Andrei Iancu
*Director of the United States Patent and Trademark Office*